United States Patent [19]

Miller et al.

[11] Patent Number: 4,750,031
[45] Date of Patent: Jun. 7, 1988

[54] HERMETICALLY SEALABLE PACKAGE FOR HYBRID SOLID-STATE ELECTRONIC DEVICES AND THE LIKE

[75] Inventors: Wilson N. Miller, Anaheim; Ormal E. Gray, Placentia, both of Calif.

[73] Assignee: The United States of America as represented by the United States National Aeronautics and Space Administration, Washington, D.C.

[21] Appl. No.: 392,093

[22] Filed: Jun. 25, 1982

[51] Int. Cl.⁴ .................. H01L 29/44; H01L 23/30; H01L 23/06; H01L 23/10

[52] U.S. Cl. ........................... 357/81; 357/72; 357/74; 174/52 S; 174/52 PE; 174/52 R; 525/425

[58] Field of Search .............. 357/81, 72, 74; 174/52 S, 52 PE, 52 R; 525/425

[56] References Cited

U.S. PATENT DOCUMENTS

| | | | |
|---|---|---|---|
| 3,155,766 | 11/1964 | Eichert et al. | 357/72 |
| 3,236,936 | 2/1966 | Robinson | 357/72 |
| 3,390,226 | 6/1968 | Beyerlein | 357/72 |
| 3,404,213 | 10/1968 | Brookover et al. | 357/74 |
| 3,430,835 | 3/1969 | Grable et al. | 357/74 |
| 3,693,239 | 9/1972 | Dix | 357/74 |
| 3,767,839 | 10/1973 | Beal | 357/74 |
| 3,789,341 | 1/1974 | Dalmasso | 357/74 |
| 3,829,598 | 8/1974 | Darnell | 357/81 |
| 3,906,144 | 9/1975 | Wiley | 174/525 |
| 4,012,579 | 3/1977 | Fox et al. | 174/52 PE |
| 4,126,758 | 11/1978 | Krumme | 357/74 |
| 4,172,261 | 10/1979 | Tsuzuki et al. | 357/81 |
| 4,303,934 | 12/1981 | Sfitt | 357/75 |
| 4,330,683 | 5/1982 | Parker | 357/74 |
| 4,331,831 | 5/1982 | Ingram et al. | 357/81 |
| 4,340,697 | 7/1982 | Aya et al. | 525/425 |

FOREIGN PATENT DOCUMENTS

| | | | |
|---|---|---|---|
| 0037301 | 10/1981 | European Pat. Off. | 357/74 |
| 976278 | 11/1964 | United Kingdom | 357/74 |
| 2057757 | 4/1981 | United Kingdom | 357/74 |

Primary Examiner—Andrew J. James
Assistant Examiner—Jerome Jackson
Attorney, Agent, or Firm—Russell E. Schlorff; John R. Manning; Edward K. Fein

[57] ABSTRACT

A small component package employing a ring frame 11 of a mouldable polyamide-imide thermoplastic directly moulded onto a heat conducting base plate 10 with integral moulded anchoring pins of the thermoplastic material engaging corresponding bores 21 and 22 through the base plate. The other edge of the ring frame 11 is metalized as is the interface area 13 with a cover plate 12 of the same thermoplastic material for a soldered seal. Multiple solid electrical leads 17, 18, 19, 20 are moulded into the ring frame 11 during the base plate-to-ring from moulding operation to provide an inexpensive, sealed package which is also light in weight. Threaded inserts 14 facilitate a firm connection to an external heat sink surface along surface 10a of base plate 10.

6 Claims, 2 Drawing Sheets

HERMETICALLY SEALABLE PACKAGE FOR HYBRID SOLID-STATE ELECTRONIC DEVICES AND THE LIKE

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; U.S.C. 2457).

TECHNICAL FIELD

The invention relates generally to sealable electronic device packages and more specifically to hermetically sealed packages for hybrid solid-state devices, small electromechanical apparatus, and the like.

BACKGROUND ART

In the electronic arts, encapsulation of electromechanical or hybrid semiconductor arrangements or the like is required in order to stabilize many of the ambient conditions to which these elements are subjected and to protect them from extremes of other conditions. This encapsulation or packaging has been variously accomplished. In particular, where hermetic sealing is required, metallic enclosures with glass-to-metal electrical lead feed through has been the standard approach.

When the package is small and appreciable voltage and power levels are extant, the conventional glass-to-metal electrical feed through arrangements are difficult to manufacture and relatively expensive. Moreover, such seals are subject to breakage and consequent failure due to incidental mechanical stresses.

Prior art packages of the type and size contemplated in the invention have been made from such materials as Kovar, steel, aluminum, copper, molybdenum and ceramic materials, all of which are relatively heavy and costly.

The known pertinent prior art is typically described in the patent literature, as follows:

U.S. Pat. No. 3,621,112 proposes a ferrous metal enclosure with the aforementioned glass-to-metal seals for the electrical feed through leads.

U.S. Pat. No. 3,575,546 shows a plastic body with "snap-in" header which is not hermetically sealable and does not provide a heat sink feature.

U.S. Pat. No. 3,548,076 is further typical of a metallic enclosure for a solid-state hybrid. Glass-to-metal seals are shown to provide the relatively large number of electrical leads required for connections to the hybrid sealed therein.

U.S. Pat. No. 3,538,597 deals with a cover plate for a "flat pack" containing microcircuits or the like. The Kovar cover plate (lid) is soldered onto an apparently metallic housing (although the insulation of electrical leads passing therethrough is not shown).

U.S. Pat. No. 2,932,684 appears to be a nonrepairable encapsulation device of typical early form. Many individual parts are included in a relatively massive, single power transistor package.

U.S. Pat. No. 3,419,763 contemplates the paralleling of a plurality of individual solid-state devices within a sealed housing structure with heat sinking features. The familiar glass-to-metal electrical lead seals through its base and metallized ceramic seals for top cover penetration are required in this package and overall weight is obviously relatively large.

U.S. Pat. No. 3,433,885 is another "all metal" enclosure for a single power semiconductor device. This enclosure is not adapted for multiple lead circuits such as semiconductor hybrids and is relatively heavy.

Devices of the prior art including those specifically mentioned hereabove suffer from the disadvantages of high cost of manufacture, relatively large weight factors and poor adaptability where multiple electrical connections are required. Wherever glass-to-metal or ceramic-to-metal seals are used, there is a hazard of chipping, fracture, loss of hermetic seal and electrical breakdown. Unintended mechanical stress applied to the leads passing through such seals significantly increases the hazard of such damage and consequent electrical breakdown.

The manner in which the invention deals with the disadvantages inherent in the prior art to produce a novel structure having particular advantages will be understood as this description proceeds.

DISCLOSURE OF THE INVENTION

The invention comprises a light-weight, inexpensively fabricated, hermetically sealable, repairable package for electronic or electromechanical devices of small size, especially for multi-connection devices such as solid-state hybrids.

A moulded ring frame of polyamide-imide plastic material is adhered along one edge to a base plate. The base plate is of highly heat conducting material, such as alumninum or copper, typically. Bores through the base plate within the area of edge surface of the ring frame in contact with the base plate afford attachment of the ring frame to the base plate during the moulding operation. The ring frame plastic material flows into these bores in the single moulding step contemplated.

The electrical leads are contemporaneously moulded into the ring frame. These leads are "L-shaped" gold-plated copper wires imbedded in the ring frame walls as they extend in the normal direction with respect to the base plate from their external projections. At a predetermined point or points within the plastic ring frame wall the leads are bent (typically, although not necessarily at 90°) so that they project into the interior volume of the ring frame for connection to the solid-state device or devices therein. Those devices may be of the type generating substantial heat and can be in thermal contact with the base plate surface within the enclosure. The outside surface of the base plate is suitable for conventional attachment to a more massive heat sink. Generally the base plate would be flat and attached to the external heat sink with a heat conductive compound material between the base plate and external heat sink.

The hermetic enclosure afforded is completed by a cover plate over the other ring frame edge. A cover plate, preferably of the same plastic material as the ring frame, may be metallized along with the edge of the ring frame so that the cover plate can be conventionally soldered in place and removed and subsequently resoldered, if necessary. The cover can be attached otherwise, of course, with epoxy adhesives, for example.

The details of a typical and preferred embodiment of the invention will be more fully described hereinafter.

BRIEF DESCRIPTION OF THE DRAWINGS

The details of the invention will be described in connection with accompanying drawings in which.

BEST MODES FOR CARRYING OUT THE INVENTION

Figure 1:
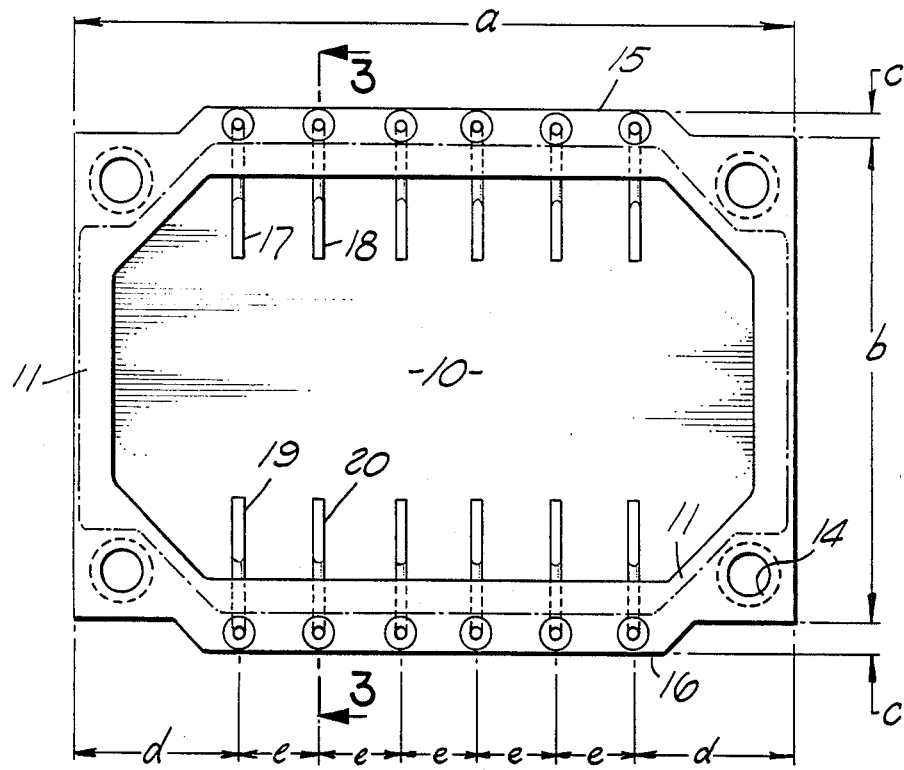
FIG. 1 is a top view of the ring-frame and base assembly of the invention combination before installation of the cover plate.
Figure 2:
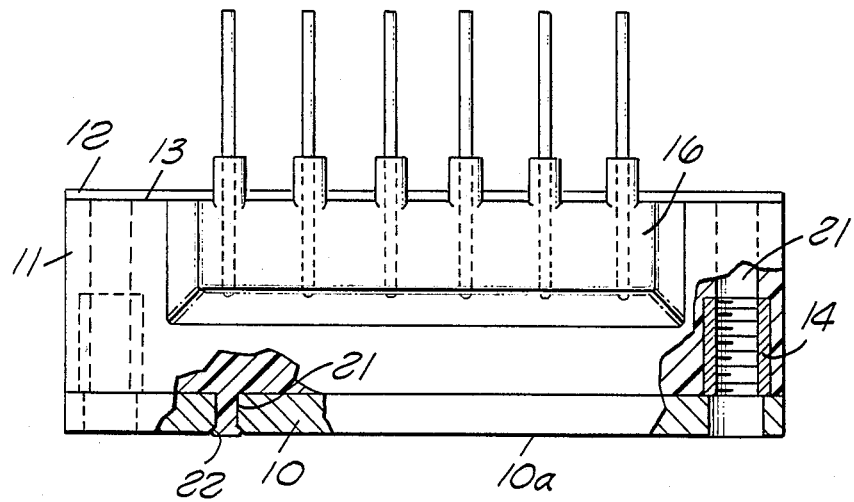
FIG. 2 is a side view of the package of FIG. 1 with the cover plate in place, the view being a partial section taken as indicated on FIG. 1.

Referring now to FIG. 1 and FIG. 2, the base plate 10 is seen to be attached to the ring frame 11 during the moulding of the ring frame. In FIG. 2, bores, typically 21 are shown with expanded head portions 22 such that, during the moulding of 11, "pins" are formed which are integral with the ring frame 11 and act to hold the edge of the ring frame into tight contact with the base plate in a tension grip. The plastic material employed flows readily into the bores 21 and head portions 22 and harden therein as the body of ring frame 11 hardens. Still further, there is substantial direct adherence of the plastic material to the surface of base plate 10 along the interface area between them.

The shape of the ring frame member can be seen in FIG. 1 in particular, the cover plate 12 shown in FIG. 2 preferably having an outside perimeter shape the same as that of ring frame 11.

It will be noted that the plural electrical leads of which 17, 18, 19 and 20 are typical, extend and are imbedded within widened portions 15 and 16 of the ring frame side wall, thereby avoiding interference with the cover plate. At a predetermined point (or points, not necessarily in alignment) the leads are bent inward to enter the interior volume within the ring frame 11 as enclosed by the base plate 10 and cover plate 12. The points at which the leads enter this interior volume may be staggered as desired to accommodate the circuitry therein.

It will be realized that the resistance to mechanical damage (of the type which is often destructive of glass-to-metal seals) afforded by the configuration of leads shown is much superior to that afforded in prior art arrangements.

Figure 3:
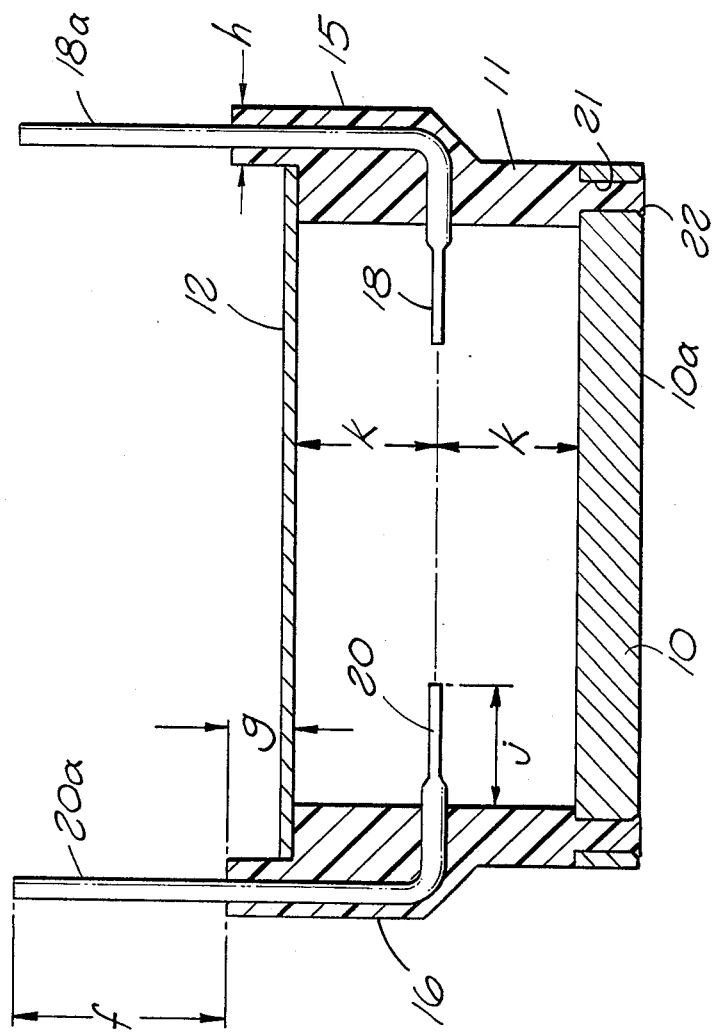
FIG. 3 is an end view of the package of FIG. 1 and FIG. 2 with cover plate in place.

The ends of leads 17, 18, 19 and 20 extending externally are visible at 17a, 18a, 19a, and 20a in FIG. 3. In addition to the moulding of the ring frame 11 to base plate 10, the aforementioned leads are moulded in place during the same operation. Still further, four threaded inserts (typically 14) are moulded into the ring frame itself for attachment of the entire assembly by means of screws through the external heat sink into these inserts from the 10a side of 10. Bore 21 provides an overtravel space for such screws.

At this point in the description the preferred material for the ring frame 11 and cover plate 12 will be described. That preferred material is a polyamideimide thermoplastic generically classed as an amorphous polymer. Such a material is available from Amoco Chemical Co. under the trademark "Torlon", and is ideal for injection moulding. It is available in a standard grade product as Torlon 5030 with 30% glass fiber and 1% PTFE (polytetrafluorethylene). When hardened, Torlon is very strong, has a dielectric strength on the order of 600 volts/mil and a volume resistivity of at least $1.2 \times 10^{17}$ ohm-cm, thereby affording the electrical properties suitable for relatively high voltage circuits. One particularly advantageous use for the invention is in connection with hybrid circuits operating at voltages up to 1000 volts dc. The addition of the glass fiber improves the ring frame coefficient of expansion match, vis-a-vis, a copper base plate at 10.

The metallizing of the edge surface of ring frame 11 at interface 13 and the congruent portion of Torlon cover plate 12 is by plating, sputtering, painting on with subsequent bake, or other conventional processes. The Torlon material is well adapted to metallizing, and for hermetic sealing along interface 13, a solder preform can be inserted and heat applied by induction heating or other conventional means.

The tooling required in the injection moulding process, including the holding in place of the electrical leads during moulding, can be readily provided within the skill of that art.

The electrical leads are normally copper, and their adherence to the Torlon moulding is enhanced by gold plating conventionally applied.

Some typical dimensions giving a concept of the physical sizes typical of packages according to the invention are as follows:

| dimension | centimeters |
| --- | --- |
| a | 12.19 |
| b | 3.05 |
| c | 0.18 |
| d | 1.02 |
| e | 0.51 |
| f | as required |
| g | 0.23 |
| h | 0.18 |
| j | 0.51 |
| k | per constraints |

The constraints affecting dimension k include the height of the semiconductor components, the voltage requirements and the "reach" capabilities of the hybrid bonding equipment.

The particular dimensions accommodate four $0.635 \times 0.635$ centimeter ($0.25 \times 0.25$ inches in the trade) semiconductor chips continuously dissipating 40 watts. The heat generated is removed by thermal contact of these chips with base plate 10 and hence to an outside heat sink through base plate 10.

FIG. 3 shows the same structure as FIG. 2, viewed from a 90° rotated point (end view). The Torlon cover plate 12 is nominally 0.50 cm. in thickness. The ring frame wall thickness varies in the embodiment shown, but can provide proper strength and stability in relatively thin sections. The Torlon material has a deflection (transition) temperature on the order of 270° Celsius. Moreover, it is resistant to nuclear and ultraviolet radiation, is rated 94V-0 (Underwriters Laboratory rating) for flame retardancy, and is out-gas free after curing. Unsealed, it will absorb and release a maximum of 0.22% water by weight at 21° Celsius with substantially no chemical or dimensional changes.

The Torlon material is an excellent substitute for metal, providing excellent strength and other characteristics. The overall weight of an assembly according to the invention is on the order of half of that of a comparable package fabricated from lightest structural metals and may be even much lighter in comparison to Kovar, ferrous metal or ceramic implementations.

From the foregoing, it will be evident that the cost of manufacture is much less than for conventional prior art packages for the purpose. This is achieved in large measure through the moulding process in which the ring frame is wedded to the base plate and the electrical leads are embedded all in one operation.

It is again emphasized that the embedded lead configuration is highly resistant to twisting or other mechanical stresses and also to vibration and thermal shock. Those effects are capable of causing failure of the hermetic sealing in the prior art.

In view of its relatively low cost and other advantages, the invention is applicable to a wide variety of uses, such as in aircraft systems, electric automobiles, industrial equipment, shipboard electronics, solar cell arrays, satellites and other space vehicles.

Variations within the scope of the invention will suggest themselves to those of skill, once the invention is understood. Accordingly, it is not intended that the invention should be regarded as limited to the specific form and materials shown and described. The drawings and this description are intended to be typical and illustrative only.

We claim:

1. A sealed solid-state electronic hybrid package comprising: a base plate for mounting at least one electronic component in thermal contact along a first surface of said base plate, said base plate having a second surface adapted to be mounted in thermal contact with a surface of an external heat sink, said base plate formed of a metal having high heat conductivity; a ring frame formed of amorphous polymer polyamide-imide material having approximately 30% glass fiber and 1% PTFE moulded into contact with said base plate first surface about a first edge surface of said ring frame, said ring frame having at least one electrical lead moulded through a side thereof, said lead projecting into the interior volume of the ring frame for connection to the electronic component; and a cover plate fabricated from amorphous polymer polyamide-imide material having approximately 30% glass fiber and 1% PTFE overlying a second edge surface of said ring frame, said second ring frame edge surface and the congruent area of said cover plate being metallized, said metallized ring frame edge and metallized cover plate area being soldered together.

2. The apparatus according to claim 1, in which said base plate comprises a plurality of bores therethrough within said edge surface of said ring frame, said ring frame including pins of said mouldable thermoplastic integral with said ring frame extending into said bores as a part thereof to secure said ring frame against said base plate.

3. The apparatus according to claim 2 in which at least some of said bores include an expanded diameter section adjacent to said base plate second surface, said pins thereby having a correspondingly enlarged end adjacent said base plate second surface for securing said ring from against said base plate first surface.

4. The apparatus according to claim 1 in which said electrical leads are L-shaped conductors, a first leg of said L-shape extending within the wall thickness of said ring frame from external points of connection to a point within said ring frame wall at which said leads are bent to form the second leg of said L-shape extending into the interior volume within said ring frame.

5. Apparatus according to claim 4 in which the side wall of said ring frame has increased thickness extending laterally outward beyond said cover plate surrounding said electrical leads whereby said electrical lead first legs pass laterally outward with respect to said cover plate.

6. Apparatus according to claim 1 in which said metallized portions of said ring frame and cover plate are areas of plated-on copper.

* * * * *